United States Patent [19]

Brandt et al.

[11] Patent Number: 5,059,857
[45] Date of Patent: Oct. 22, 1991

[54] INTEGRAL CONNECTOR FOR A PIEZOELECTRIC SOLID STATE MOTOR STACK

[75] Inventors: Everett G. Brandt, Chillicothe; Morris A. Swanson; Kurtis C. Kelley, both of Washington; Carey A. Towe, Peoria, all of Ill.

[73] Assignee: Caterpillar Inc., Peoria, Ill.

[21] Appl. No.: 589,844

[22] Filed: Sep. 28, 1990

[51] Int. Cl.[5] .......................................... H01L 41/08
[52] U.S. Cl. .................................. 310/366; 310/338; 310/328
[58] Field of Search ........................ 310/366, 328, 338

[56] References Cited

U.S. PATENT DOCUMENTS

| 2,842,686 | 7/1958 | Musser et al. | 310/338 |
|---|---|---|---|
| 3,031,591 | 4/1962 | Cary et al. | 310/338 |
| 3,349,259 | 10/1967 | Kistler | 310/338 |
| 3,495,102 | 7/1967 | List et al. | 310/338 |
| 3,501,099 | 3/1970 | Benson | 239/585 |
| 3,801,838 | 4/1974 | Kistler | 310/338 |
| 4,408,479 | 10/1983 | Asai et al. | 310/338 |
| 4,410,825 | 10/1983 | Lobastov | 310/338 |
| 4,570,097 | 2/1986 | Shukla et al. | 310/338 |
| 4,570,098 | 2/1986 | Tamita et al. | 310/328 |
| 4,729,459 | 3/1988 | Inagaki et al. | 310/325 |

FOREIGN PATENT DOCUMENTS

| 0319038A2 | 6/1989 | European Pat. Off. | |
| 0066980 | 3/1988 | Japan | 310/366 |
| 2193386 | 2/1988 | United Kingdom | 310/328 |

OTHER PUBLICATIONS

Publication prepared by Physics International Company entitled "Piezoelectric Materials," (Publication date unknown).

Primary Examiner—Mark O. Budd
Assistant Examiner—Thomas M. Dougherty
Attorney, Agent, or Firm—Sterne, Kessler, Goldstein & Fox

[57] ABSTRACT

An integral connector for a piezoelectric solid state motor stack having a plurality of ceramic disks interleaved with electrodes. Lead wires connect the electrodes to a source of electrical potential. A housing, for containing the motor stack, includes a connector body mounted to one end portion of the housing. A plurality of contact pins mounted to the connector body are adapted to be connected to the source of electrical potential. A structure defines a path for guiding the lead wires between the contact pins and the electrodes, wherein the lead wires exit the combination of the ceramic disks and electrodes along first and second parallel longitudinal axes separated by a first distance, and attach to the pins which are located along third and forth parallel longitudinal axes separated by a second distance, wherein the first distance is different from the second distance.

10 Claims, 5 Drawing Sheets

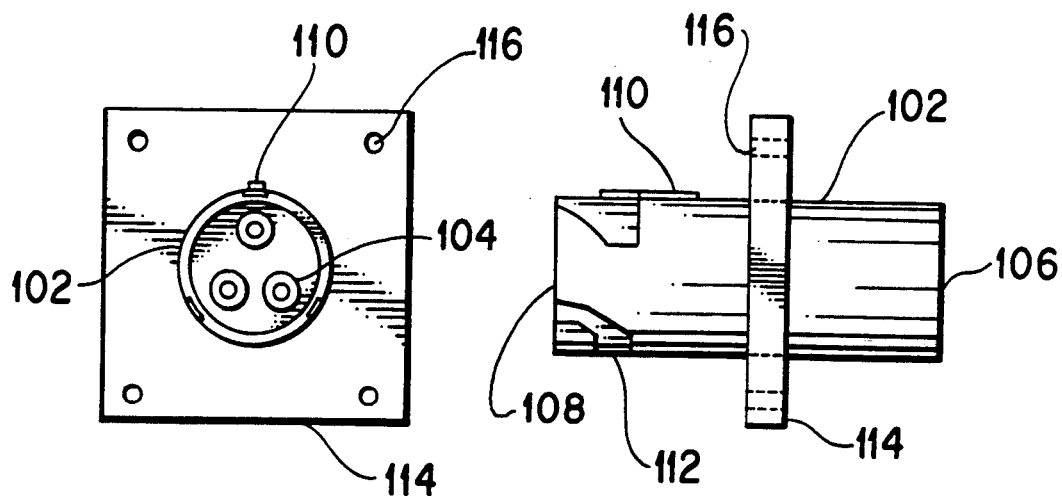
FIG. 1A
PRIOR ART
FIG. 1B
PRIOR ART
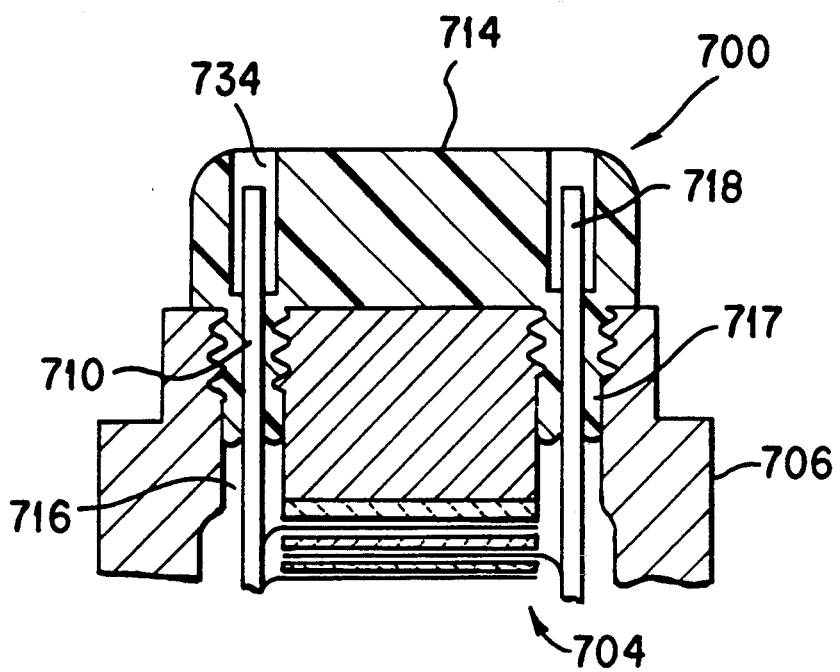
FIG. 7

INTEGRAL CONNECTOR FOR A PIEZOELECTRIC SOLID STATE MOTOR STACK

BACKGROUND OF THE INVENTION

1. Field of the Invention

The field of the invention relates generally to solid state motor actuators. More particularly, the invention relates to integral connectors for piezoelectric solid state motor stacks.

2. Related Art

For decades electroexpansive materials have been employed in stacked structures for producing actuation used for fuel injection and valve control in diesel engines, for example. Commercially manufactured solid state motor stacks, or actuators, are produced using piezoelectric disks interleaved with metal foil electrodes. Application of high voltage and resulting high peak current power to alternately biased electrodes causes each of the piezoelectric disks to expand or axially distort. The additive deflection of the stacked disks is typically amplified by hydraulics to effectuate useful actuation.

An example of a conventional electromechanical actuator having an active element of electroexpansive material is found in U.S. Pat. No. 3,501,099 to Glendon M. Benson. Benson's 1970 patent is directed to both an actuation amplification structure and a method for manufacturing piezoelectric stacks. Sheets of ceramic material are rolled, compacted and punched into ceramic disks. After a cleaning process, the disks are stacked with alternate sets of continuous disk electrodes disposed between the ceramic disks. The stacks undergo a pressurized cold-welding process, followed by an elevated temperature and pressure bonding process after common electrodes are connected to the two electrode groups. The stacks are poled by application of a DC voltage and then encapsulated with a plastic insulative cover prior to final mounting within a transducer housing.

Conventionally, and as mentioned above, stacks are connected to high voltage power supplies for application of driving voltages to produce actuation. Connection of the driver to the stack is problematic, however, due to the environments in which stacks are used. Mounting of stacks on engine heads, for example, exposes stack/driver connectors and accompanying wiring harnesses to high temperatures, powerful resonant vibrations and, at times, corrosive agents such as diesel fuel and engine cleaners.

Many high voltage electrical connectors have been developed for use in such harsh environments, but none have yet been designed or adequately adapted for use with piezoelectric solid state motor stacks.

The present invention overcomes the deficiencies of the conventional technology noted above.

SUMMARY OF THE INVENTION

The present invention is directed to an integral connector for a piezoelectric solid state motor stack having a plurality of ceramic disks interleaved with electrodes, and lead wires for connecting the electrodes to a source of electrical potential. The present invention comprises a housing containing the motor stack, a connector body mounted to one end portion of the housing and a plurality of contact pins mounted to the connector body and adapted to be connected to the source of electrical potential. The invention also comprises a structure for defining a path for guiding the lead wires between the contact pins and the electrodes, wherein the lead wires exit the combination of the ceramic disks and electrodes along first and second parallel longitudinal axes separated by a first distance, and attach to the pins which are located along third and forth parallel longitudinal axes separated by a second distance, wherein the first distance is different from the second distance. Moreover, the present invention comprises a structure for securely attaching the connector body means to the housing.

BRIEF DESCRIPTION OF THE DRAWINGS

The invention will be better understood if reference is made to the accompanying drawings in which:

FIGS. 1A and 1B show an end view and side view, respectively, of a conventional connector;

FIG. 7 is a cross-sectional view of a still further embodiment of an integral connector formed in situ on a piezoelectric solid state motor stack housing in connection with the present invention.

DETAILED DESCRIPTION OF THE PREFERRED EMBODIMENTS

Figure 2:
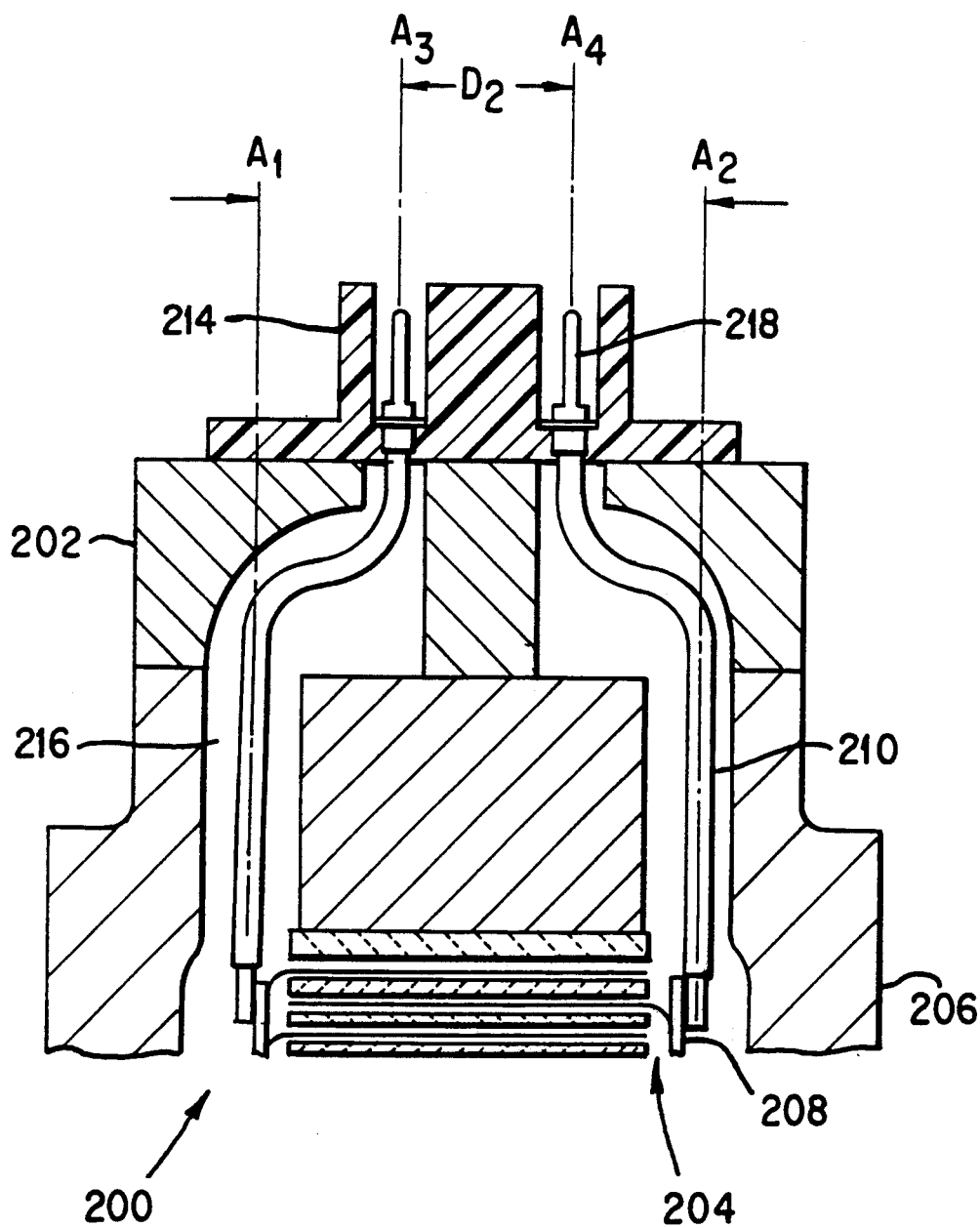
FIG. 2 is a cross-sectional view of an integral connector for a piezoelectric solid state motor stack in connecting with the present invention.

The Deutsch Co. high voltage HD10 series 3-pin receptacle-connector is suitable for adaption for use in connection with the present invention with modification. Preferably, the present invention uses 2 of the 3 available pins. FIGS. 1A and 1B show a Deutsch Co. HD10 series connector 100 (referred to as the "HD10"). FIG. 1A is an end view of the HD10 showing cylindrical housing 102 and contact pin acceptor holes 104. FIG. 1B is a side view of the HD10 showing the Wire entry end 106 and the mating end 108, respectively. The HD10 connector has a polarizing tab 110. The connector has bayonet locking mechanisms, or mating ramps, 112. Square flange 114 includes holes 116 for mounting.

A first embodiment of the present integral connector invention comprises a modified HD10 and an adaptor/spacer for attaching the modified HD10 to a piezoelectric solid state motor stack housing. FIG. 2 represents a modified integral connector 200 having a spacer 202. An electrode/ceramic disk stack 204 is located in a protective housing 206. Bus bars 208 are connected to two groups of interleaved electrodes and are biased by an external source of electrical potential via lead wires 210. The preferred embodiment of an assembled piezoelectric solid state electrode/disk stack 204 is described in the concurrently filed, commonly assigned co-pending application Ser. No. 07/589855 titled "Piezoelectric Solid State Motor Stack", the entire disclosure of which is incorporated herein by reference.

Spacer 202 includes a channel or cavity 212 which acts as a guide to permit lead wires 210 to attach to a modified connector 214. The spacer is necessary in this embodiment, because the wire entry ports on the bottom of modified connector 214 are closer to a center longitudinal axis of the stack than are lead wire ports 216 of the protective housing 206. Spatially, lead wires 210 are positioned along first and second parallel longitudinal axes $A_1$ and $A_2$, respectively, separated by a first distance $D_1$, and are attached to contact pins 218 which are located along third and forth parallel longitudinal axes, $A_3$ and $A_4$, respectively, separated by a second distance $D_2$, where the first distance is greater than the second ($D_1 > D_2$). Note that axes $A_3$ and $A_4$ are closer to the center axes of the stack than axes $A_1$ and $A_2$. In a preferred embodiment, the contact pins are Deutsch Co. Part No. 0460-202-16141.

FIGS. 3-7 show variants of the above-described embodiment of the present invention. FIGS. 3-7 represent structures for attaching an integral connector to a piezoelectric solid state motor stack.

Figure 3:
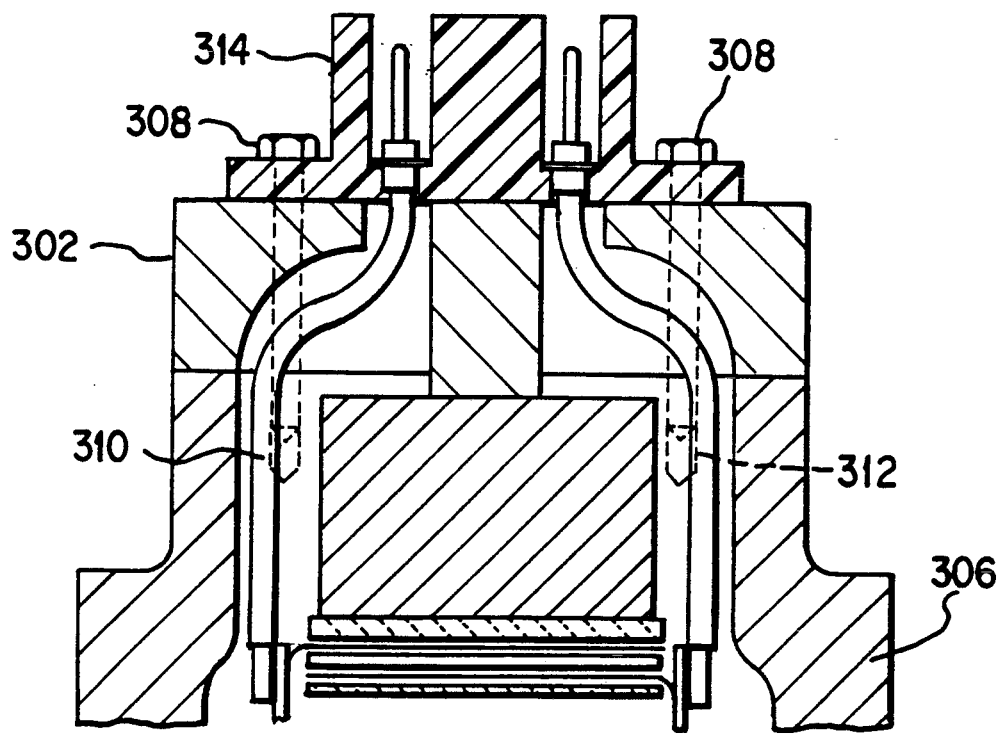
FIG. 3 is a cross-sectional view of another embodiment of an integral connector in connection with the present invention.

FIG. 3 shows a structure 300 for mechanically connecting the integral connector to the protective housing 306 of the motor stack. A fastening device 308 secures the integral connector to the housing 306. The fastener anchors both the flanged connector 314 and the spacer 302 to the housing. Preferably, the fastener comprises a machine screw which passes through a screw hole in the flanged connector 314 and a channel or groove in the side surface of the spacer member 302. The machine screw 308 is then threaded into threaded holes 312 in the upper surface of the housing member 306. Preferably, at least two such fasteners secure the connector and spacer to the motor stack housing. Machine screw 308 is shown in phantom, because it lies behind the plane depicted in the figure. Other commonly known fasteners may be used.

Figure 4:
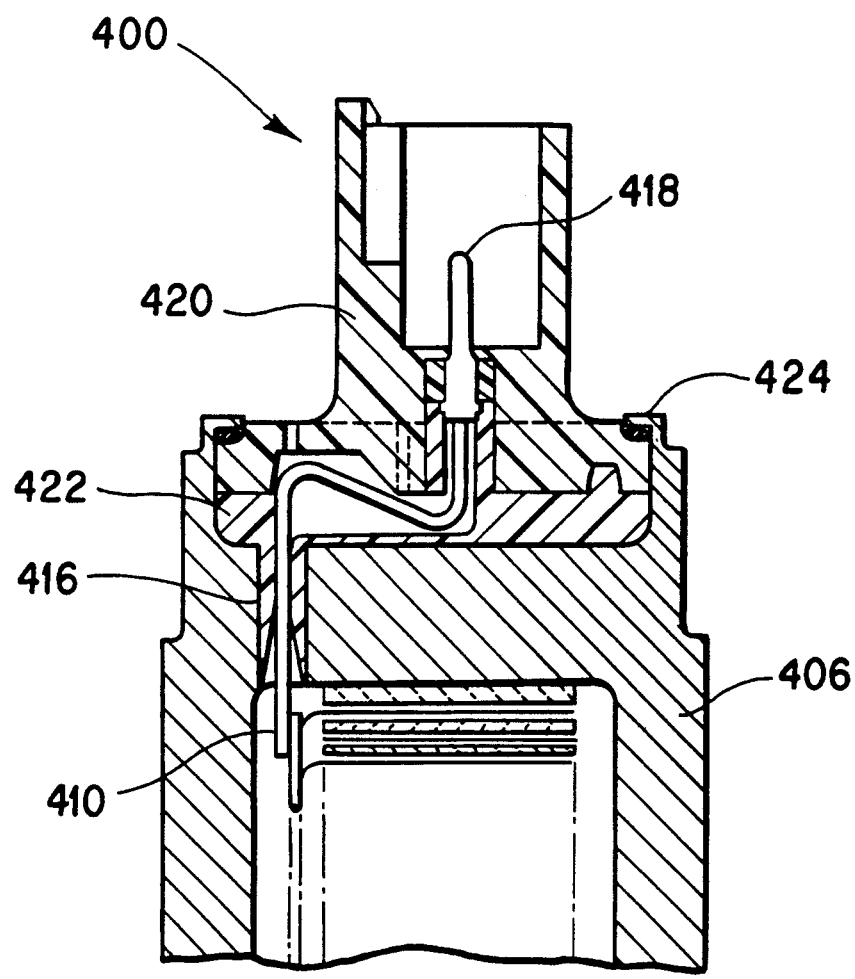
FIG. 4 is a cross-sectional view of a further embodiment of an integral connector in connection with the present invention.
Figure 5A:
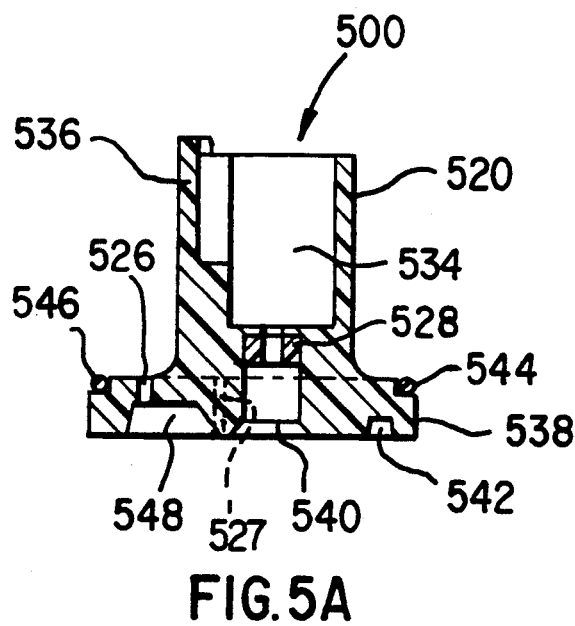
FIGS. 5A and 5B represent a cross-sectional view and a top view, respectively, of a receptacle for an integral connector in connection with the present invention.
Figure 6A:
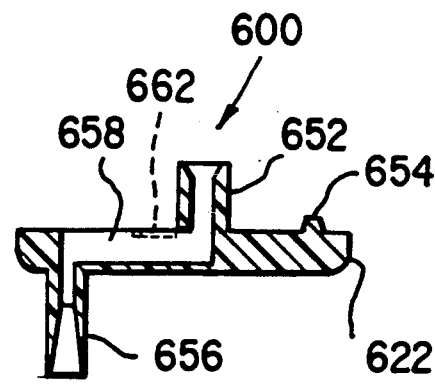
FIGS. 6A and 6B represent a cross-sectional view and a top view, respectively, of a spacer for an integral connector in connection with the present invention.
Figure 5B:
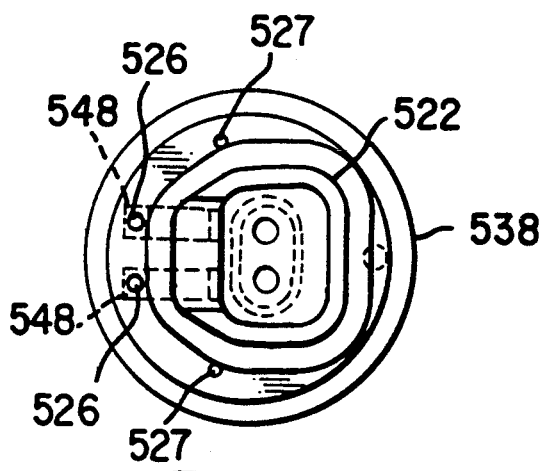
Figure 6B:
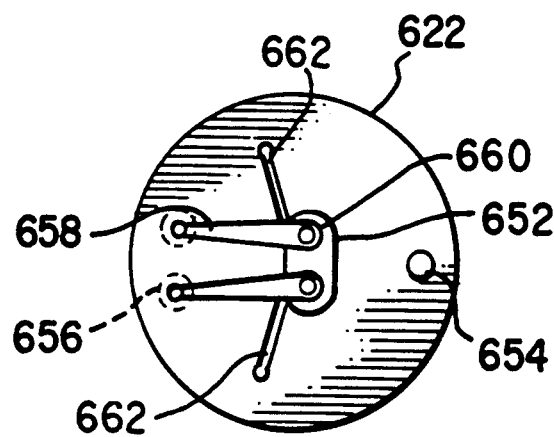

FIGS. 4-6 show a further integral connector embodiment employing a connector similar to that of the DT series made by Deutsch Co. The method for securing the integral connector of this embodiment to a stack housing is shown at 400 of FIG. 4. The connector assembly comprises a receptacle section 420 and a spacer 422. Housing 406 is modified to include an extension (or a mechanical joint or a bonded joint) 424 to secure the combination of the receptacle 420, spacer 422 and pins 418. Receptacle section 420 and spacer 422 are shown separately in FIGS. 5A, 5B and 6A, 6B, respectively.

The receptacle 500 is shown at FIG. 5A. A top view of receptacle 500 is shown at FIG. 5B. Upper section 520 of the receptacle includes a plug opening 534 to accept a plug for external electrical connection to pins 418. Section 536 is for securing a plug in the receptacle. Lower flange 538 is formed with holes 540 to accept the pins and pin mounting section 652 of spacer 600. See FIG. 6. Hole 542 is formed to accept spacer projection 654 for positive orientation between the receptacle 520 and spacer 622.

An O-ring 544 is located at the perimeter of the receptacle flange 538 and seats in recess 546. Upper spacer channels 548 permit passage of lead wires 410 as shown in FIG. 4. Housing extensions 424 are crimped down on O-ring 544 to secure the integral connector. The O-ring 544 acts as a seal to keep contaminants out of the housing cavity when the motor stack is mounted in an engine in its operative environment.

In addition to the O-ring, further sealing may be done by filling the receptacle and spacer inner cavities with an encapsulant. The encapsulant is injected via receptacle holes 526 to fill cavities 540, 548 and 658. Receptacle holes 527 and spacer groves 662 permit ambient communication to prevent pressure build up during injection of the encapsulant. Any commercially available sealant may be employed in a known manner.

The pins are sealingly mounted with molded seal 528 in the integral connector as shown in FIG. 5A. The O-ring 544 and molded seal 528 are formed of silicone rubber, or the like.

Turning now to FIG. 6, spacer 600 includes pin mounting section 652 attached to main spacer body 622. Also attached to main body 622 is spacer projection 654. Lower projection 656 is attached to the bottom of main body 622, and fits into the upper section of the stack housing as shown at 416 of FIG. 4. Lower projections 656, upper spacer channels 548 and lower spacer channels 658 provide tortuous path for the stack lead wires from the periphery of the housing to where they interface with the pins 418 which are located closer to the central axis of the housing.

A top view of spacer 600 is at FIG. 6B. Two pin mounting holes 660 are spaced apart from one another at pin mounting section 652. Lower projection 656 and spacer channel 658 are also shown. As stated above, grooves 662 are formed in spacer 622 to permit air to pass from the inner cavities through receptacle holes 527 during injection of a sealant.

Receptacle 520 and spacer 622 are preferably formed of reinforced or molded plastic, or equivalents like that used for the Deutsch HD10, for example.

The present invention thus provides a sealed electrical connection between the motor stack in the housing and a source of electrical potential (not shown) when the assembly is mounted in its operative configuration.

FIG. 7 shows a still further embodiment of the integral connector at 700. In this embodiment, the integral connector 714 is formed, in situ, by pouring a thermosetting-type compound into a mold (not shown) held in-place on top of the piezoelectric stack housing. The top surface of the housing 706 and the inner surfaces of the threaded holes 716 form a surface substrate for adherence of the thermosetting-type compound. Formed connector access ports 734 electrically isolate and allow connection of an electrical plug to conductor leads 718 that pass through threaded holes 716 in the piezoelectric stack housing 706.

During formation of the integral connector 714 the thermosetting-type compound fills the volume of the threaded holes 716 in the piezoelectric stack housing 706 to form anchors 717. The reason for filing the holes in this manner is to secure the integral connector 714 so that it is not easily movable. Aside from the anchoring of the integral connector by filling the connector access ports, further structural support may be obtained by filling additional indentations on the top of the piezoelectric stack housing (not shown). Compounds such as epoxy may be used to form the integral connector.

Contoured access ports 734 should be formed by the mold to facilitate connection to the ends of conductor leads 718. The interior surface of the holes may take any practical shape to permit the integral connector to connect to commercially available connector plugs. The conductor leads protrude to function as contact pins.

The exterior shape of the integral connector 714 is not crucial to the invention. Many profiles may be employed to facilitate use of a wide variety of commercially available wiring harnesses, as would be become apparent to those skilled in the art. The exterior of the integral connector 714 should, however, be smaller that the hexagonal fitting of the housing. This prevents potential damage to the integral connector during installation of the piezoelectric solid state motor stack While various embodiments of the present invention have been described above, it should be understood that they have been presented by way of example, and not limitation. These examples are intended to cover elements or steps that perform substantially the same functions, in substantially the way to achieve the same result, as viewed by those of skill in the art. Thus the breadth and scope of the present invention should not be limited by any of the above-described exemplary embodiments, but should be defined only in accordance with the following claims and their equivalents.

What is claimed is:

1. An integral connector for a piezoelectric solid state motor stack having a plurality of ceramic disks interleaved with electrodes, and lead wires for connecting the electrodes to a source of electrical potential, comprising:
   a housing containing the motor stack, said housing having an end surface with a pair of openings formed therein through which the lead wires pass;
   a spacer having first and second opposing surfaces, said first surface contacting a substantial surface area of said end surface of said housing, and a cavity formed at least in part by said spacer through which the lead wires pass; and
   a connector fixedly mounted to said second spacer surface, said connector including a plurality of contact pins mounted in said connector and adapted to be electrically connected to the lead wires and the source of electrical potential.

2. An integral connector according to claim 1, wherein said housing further comprises means for attaching the combination of said connector and said spacer thereto.

3. An integral connector according to claim 2, wherein said third means further comprises a mechanical joint.

4. An integral connector according to claim 2, wherein said means for attaching further comprises a fastener.

5. An integral connector according to claim 1, wherein the combination of said connector and said spacer further comprise first and second ports communicating with said cavity and configure to permit encapsulation of the lead wires in said cavity.

6. An integral connector according to claim 1, wherein said cavity is between said spacer and said connector.

7. An integral connector according to claim 1, wherein said cavity is between said spacer and said housing.

8. An integral connector according to claim 1, further comprising connector access ports formed in said molded body to permit external access to the lead wires.

9. An integral connector according to claim 8, wherein said connector access ports coincide with at least one of said anchors.

10. An integral connector for a piezoelectric solid state motor stack having a housing containing the motor stack and having an end surface with a pair of openings formed therein through which lead wires pass, wherein the integral connector comprises:
    a molded body formed in situ on the end surface of the housing, said molded body having at least two permanent anchors formed integral therewith and located in the housing openings, wherein said molded body and said anchors conform to the end surface of the housing and the surfaces of the housing openings in which they are in contact with.

* * * * *